United States Patent [19]

Jaggar

[11] 3,875,479

[45] Apr. 1, 1975

[54] ELECTRICAL APPARATUS

[76] Inventor: Gilbert R. Jaggar, 702 Edwards Rd., Apt. 63, Greenville, S.C. 29607

[22] Filed: May 7, 1973

[21] Appl. No.: 358,069

[52] U.S. Cl. .......... 317/101 CM, 29/626, 174/68.5, 339/17 C

[51] Int. Cl. .............................................. H05k 1/18

[58] Field of Search ............174/68.5; 317/101 CM, 317/101 CC, 101 D; 74/88 B, 72 B, 317/72 A; 29/625, 626; 339/17 C, 339/18 R, 18 C, 18 P, 19

[56] References Cited

UNITED STATES PATENTS

| | | | |
|---|---|---|---|
| 2,512,820 | 6/1950 | Bader | 339/18 C X |
| 3,178,668 | 4/1965 | Weimer et al. | 174/88 B X |

OTHER PUBLICATIONS

Chellis et al., "Charge Method for Multilayer Circuit Card," IBM Technical Disclosure Bulletin, Vol. 11, No. 11, April 1969, p. 1465.

*Primary Examiner*—Darrell L. Clay
*Attorney, Agent, or Firm*—Roger L. Martin, Esq.

[57] ABSTRACT

Internal printed circuits on multi-layer or laminated circuit boards are electrically connected to resistors, capacitors and the like circuit components by connector pins that abut the internal printed circuit at an end extremity and are frictionally held in a hole in the board that to the exterior of the board only at the component mounting side of the board. The pins have a shoulder that limits the penetration during assembly procedures and another hole in which the lead wire of the circuit component is frictionally engaged.

4 Claims, 8 Drawing Figures

ELECTRICAL APPARATUS

The invention relates to electrical apparatuses and more particularly to laminated or multi-layer printed circuit boards and circuit connectors therefor. The use of printed circuit boards in the assembly of electrical and electronic circuits for electrical apparatuses and devices is well known. The boards in such cases are made of a suitable electrically non-conductive material and are printed, by processes well known in the art, with electrically conductive metal leads that serve to electrically interconnect circuit components such as resistors, capacitors and the like, and which are mounted on the circuit boards during the assembly of the electrical apparatus. The circuit boards are commonly made from Fiberglass reinforced epoxy or polyester resins materials and the printed leads are commonly made of copper, brass or aluminum.

The quest for compactness in the industry has led to the use of multi-layer or laminated circuit board structures in which each layer or laminae is imprinted with conductive leads prior to the final assembly of the layers into the multi-layer or laminated board structure. Thus in the laminated board structures many of the electrical lead elements are located internally in the laminated structure between the confronting faces of the layers or laminae. In conventional practice, the spaced printed leads in the laminated board structure are electrically interconnected by providing a hole in the board structure which is contiguous to the spaced lead elements and the surface defining the hole is coated with an electrically conductive metal, as by a suitable plating process that is carried out after the layers have been secured together in the laminated board structure. This method has not proven entirely satisfactory since the printed leads in such cases have exceedingly small cross sectional areas that are exposed at the surface of the hole and this imposes exacting requirements and close tolerances on the additional plating process which is needed to interconnect the leads. Apart from this, it has been found that the plated connections frequently fail when the circuit boards are subjected to vibrations during the end use of many of the electrical apparatuses.

In practice, such circuit components as capacitors and resistors are usually connected to the internally located printed lead elements through the use of pin-type mounting connectors that have a shank which extends through aligned holes in the layers of the laminated circuit board. the surface defining the hole is again plated in many cases so as to provide an electrical connection with the internally located printed lead and to also provide a contact surface for the metal pin. In other cases, the pins are soldered in the holes and reliance is had upon a soldered connection between the connector pin and the small cross sectional printed lead area that is exposed at the hole. These methods of establishing electrical connections with the internally located printed circuit leads suffer from the same disadvantages that arise in interconnecting spaced printed leads through the use of plated connections. Thus the connections are subject to mechanical failure under vibrating conditions and involve a time consuming process that adds to the expense of manufacturing the assembled circuit. In addition, since most of the connectors in use project entirely through the laminated circuit board structure and hence through layers other than those carrying the interconnected printed circuit leads, useful space for the printing of circuitry is unnecessarily taken up in providing the apertured structure. This, of course, detracts from compactness and complicates the actual design of the multi-layer boards involved.

Various methods are used for mounting the standard circuit components such as capacitors and resistors on the pin-type connector mounts, and in most cases the lead wire for the circuit components is manually soldered to the pins in the final assembly of the electrical apparatus on the circuit board. This is time consuming and expensive in labor costs and the need exists for a simple yet effective method for electrically connecting the circuit components with the connector pins.

A general object of the invention is to provide an improved laminated circuit board and circuit connector arrangement. One particular object is to provide a connector arrangement for multi-layer circuit boards that avoids the need for using soldered or plated connections with the internally located conductive printed leads. Yet another object is to provide a printed circuit connector arrangement for multi-layer circuit boards and which uses a minimum amount of printed space on the layers of the laminated structure in order to make the electrical connections with the internally located printed circuit lead. Yet another object of the invention is to provide circuit component mounting and printed lead connector arrangements for laminated circuit board structures and which reduce the cost of labor involved in assemblying the circuit components on the boards.

In accord with the invention, the lead wire of a circuit component which is to be electrically connected to an internally located lead element in a multi-layer printed circuit board is connected to the lead element by means of an electrically conductive metal connector pin which only extends through a portion of the laminated board structure and is so mounted on the board as to have an end extremity which is in physical contact with a surface area of the internally located printed lead element. This arrangement has certain advantages over the prior art methods that involve the use of metal pins. For one it permits the exposure of a substantial surface area of the printed lead for physical contact with the connector pin and avoids the need for an internally located soldered connection with the printed lead or the need for plating the surface defining the socket-type hole for the pin in order to provide a substantial exposure area for contact with the pin. The arrangement used in the practice of the invention also avoids the need for using pins which extend all the way through the circuit board layers and hence additional surface area on the board layers is available for printing circuit leads in contrast to those prior art situations where the connector pin extends entirely through the laminated structure.

The pin-type connectors in accord with certain aspects of the invention are held in place in the socket-type holes through frictional contact with the socket defining surfaces. This avoids the need for using adhesives and extra time consuming steps during the assembly of the electrical devices and obviously reduces the cost of manufacturing such devices.

As previously indicated the invention contemplates an electrical connection with the internally located printed lead at the end extremity of the connector pin and in accord with one aspect of the invention the pins that are employed are provided with a shoulder that is offset from the end extremity that makes physical contact with the internally located printed contact surface area. This shoulder serves to bear against the mounting side of the circuit board when the pin is received in the socket-type hole and serves as a stop that limits the penetration of the pin shank in the board structure and hence damage to the printed lead during the assembly process.

Yet other aspects of the invention relate to the method used for mounting the circuit component on the pins. In accord with this aspect of the invention the pins are provided with a hole at the shoulder end of the shank and which is adapted to receive the lead wire of the circuit component that is to be connected to the internally located printed lead in a press fit so that the lead wire and connector pin are secured together by frictional forces. This arrangement enables the electrical circuit component to not only be readily assembled on the board during the manufacturing process but also facilitates their removal and replacement during the repair of the circuits without the need for heat treatments that are designed to melt soldered connections and which frequently cause failure and unrepairable damage to printed circuitry involved in the board structure.

The novel features which are believed to be characteristic of this invention are set forth with particularity in the appended claims. The invention, itself however, both as to its organization and method of operation, together with further objects and advantages thereof, may best be understood by reference to the following description taken in connection with the accompanying drawings, in which:

Figures 1, 2, 8:
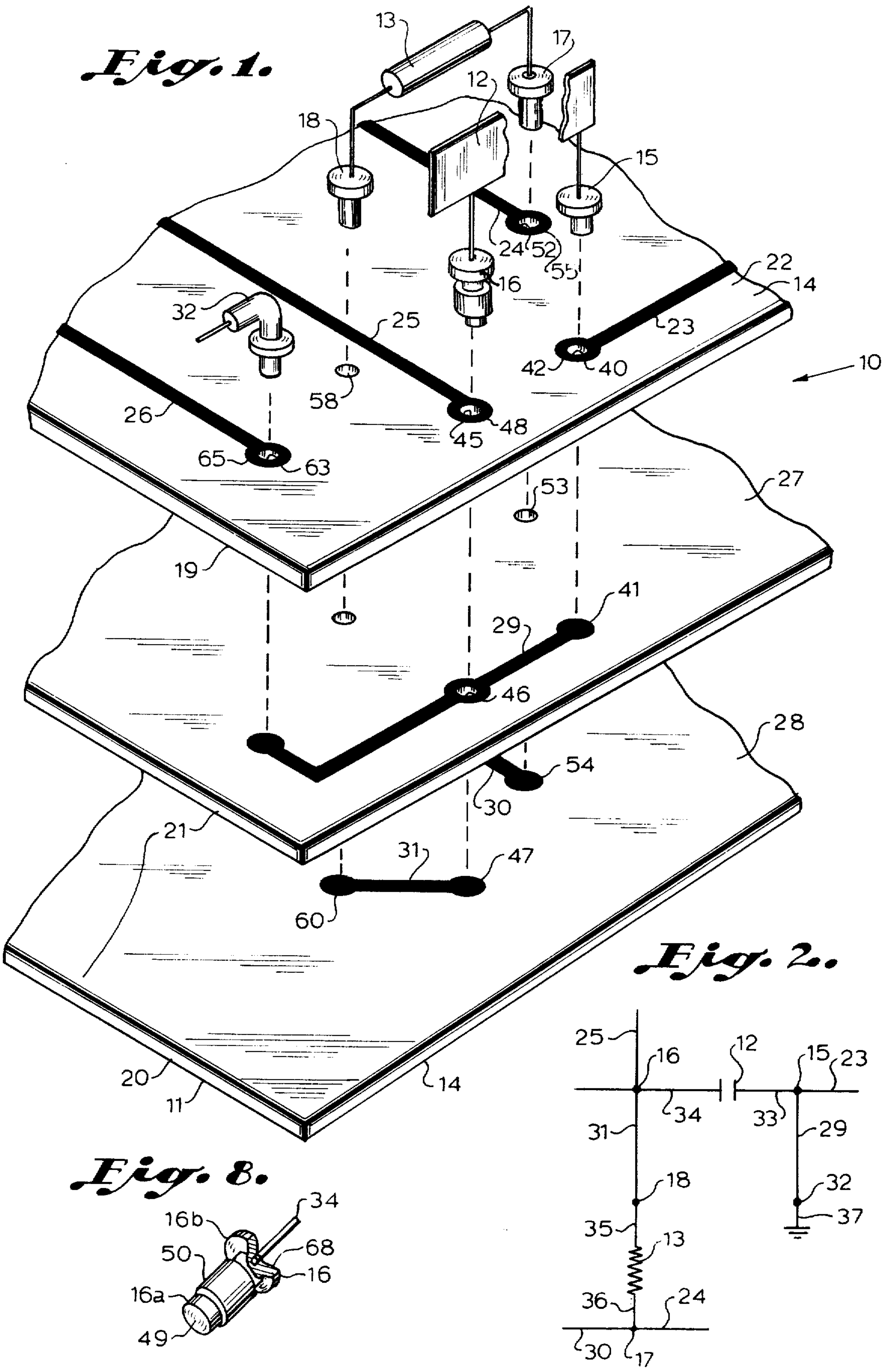
FIG. 1 is an exploded view of a fragment of an electrical apparatus embodying the principals of the invention.
FIG. 2 is a schematic diagram illustrating the fragment of the electrical circuit involved in the structure seen in FIG. 1.
FIG. 8 is an isometric view of still another pin-type connector seen in FIGS. 3 and 4.
Figure 3:
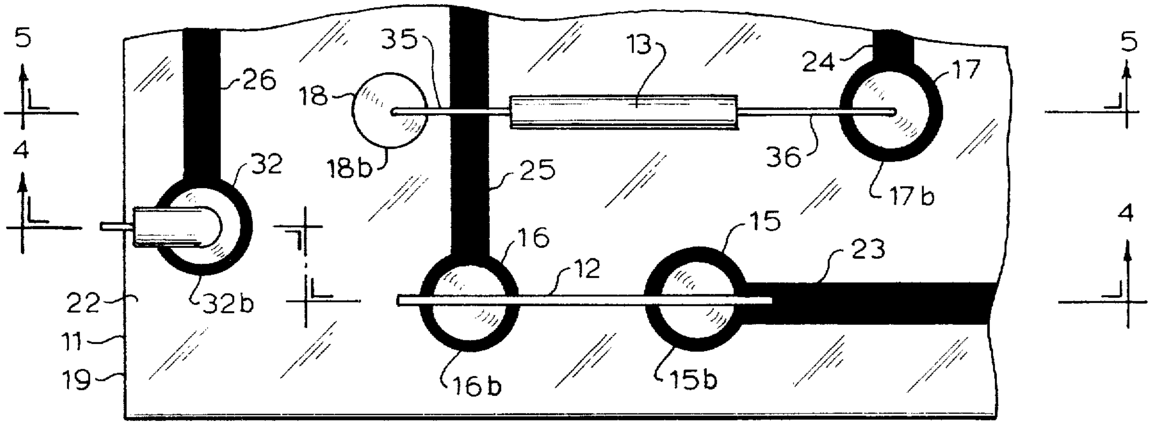
FIG. 3 is a plan view of the fragment of the electrical apparatus as generally seen at the component mounting side in FIG. 1.
Figure 4:
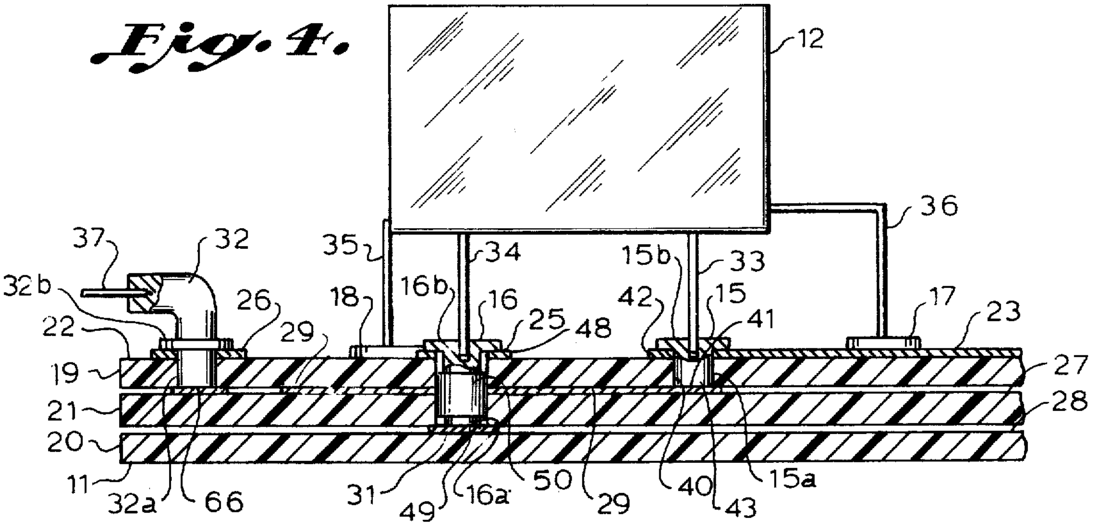
FIG. 4 is a cross sectional view taken generally along the Lines 4—4 of FIG. 3.
Figure 5:
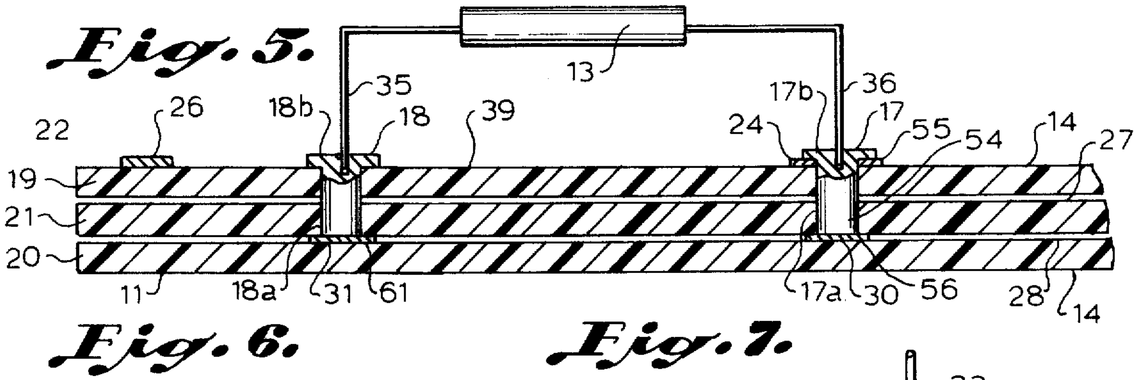
FIG. 5 is another cross sectional view taken generally along the Lines 5—5 of FIG. 3.

Reference is now made to the drawings and more particularly to FIGS. 1, 3, 4 and 5 and wherein a fragment of an electrical apparatus embodying the principals of the invention is generally designated at 10. It includes a generally flat, rigid laminated printed circuit board 11 which has opposite sides 14 and on which a capacitor 12 and resistor 13 are seen as mounted as by means of electrically conductive metal pins that are designated at 15, 16, 17 and 18.

Board 11 includes an internal layer 21 that is sandwiched between opposite side layers 19 and 20 in the assembled laminated board structure. These layers 19 through 21 are secured together in face to face relation, as by means of a suitable adhesive material (not shown), and this arrangement provides internal surfaces in the assembled board structure which amy be imprinted prior to their assembly with suitable electrically conductive flat metal lead elements. Layers 19 through 21 may be made of any suitable electrically nonconductive material, a fiberglass reinforced resins material structure being depicted in the drawings, while the electrically conductive metal lead elements may be made from copper, aluminum, brass or other suitable electrically conductive material.

As best seen in the exploded view of FIG. 1, the exterior surface 22 of side layer 19 is imprinted at the mounting side of the board with metal lead elements designated at 23, 24, 25 and 26 while the interior surfaces 27 and 28 of layers 21 and 20 respectively are imprinted with flat metal electrically conductive lead elements designated at 29, 30 and 31. Each of the layers 19, 20 and 21 of board 11 is of uniform thickness and the pins employed in the circuit connections have a predetermined length that adapts the pins for its contemplated circuit connection. In the illustration pin 15 serves to electrically interconnect one lead wire 33 of capacitor 12 with the spaced leads 23 and 29 that are imprinted upon the exterior and interior surfaces 32 and 27 respectively. Pin 16, on the other hand, serves to electrically interconnect the other lead wire 34 of capacitor 12 with the flat metal leads 25 and 31 that are imprinted upon the exterior and interior surfaces 22 and 28 respectively. Pin 18 serves to electrically interconnect one lead wire 35 of resistor 13 with the printed lead 31 upon interior surface 28 while pin 17 serves to electrically interconnect the other lead wire 36 of the resistor 13 with the spaced printed leads 24 and 30. These circuit connections are schematically illustrated in FIG. 2, and in addition to pins 15 through 18 inclusive, the apparatus 10 has yet another pin 32 which serves to electrically interconnect a grounded lead wire 37 with the spaced printed circuit lead element 26 and 29.

Each connector pin is equipped with a radially extending flange or shoulder that is adapted to contact and thus bear against the mounting side of the printed circuit board 11 in the assembled apparatus 10. The board 11 has a socket forming hole that extends from the mounting side 39 inwardly to an internal extremity that exposes and is thus defined by a contact surface area of the flat lead element involved in the circuit connection. The pin involved in making the electrical connection with the internally located lead element has a shank which is adapted to fit into the socket forming hole in a manner such that its end extremity is in physical contact with the contact surface area of the internally located printed lead element. The shanks of the circuit connector pins 15, 16, 17, 18 and 32 are designated at 15*a*, 16*a*, 17*a*, 18*a* and 32*a* respectively while the flanges of these connector pins are designated at 15*b*, 16*b*, 17*b*, 18*b* and 32*b* respectively in the drawings. The length of the shank in each instance is determined by the internal board location of the lead element involved in the electrical connection and its position in relationship to the printed board circuit at the mouth of the socket receptacle. The shoulder component of the pin aids in the assembly of the apparatus by serving as a stop which engages the mounting side 39 of the apparatus as the pin is placed in the socket and limits the penetration of the shank into the board structure so that although the end extremity of the shank makes physical contact with the contact surface area of the lead element involved, it nevertheless prevents penetration of and hence damage to the internally located printed lead element.

In the illustrated embodiment, and as best seen in the exploded view of FIG. 1, layer 19 has a socket forming hole 40 which is aligned with a contact surface area 41 of internally located printed lead element 29. Externally located printed lead element 23 has an annular contact surface area 42 that surrounds the external opening or mouth of hold 40 and in making the electrical connection between leads 23 and 29, the shoulder 15*b* of pin 15 bears against and hence is in physical contact with the annular contact surface area 42 while the end extremity 43 of the connector shank 15a bears against and is in physical contact with the contact surface area 41 of lead 29. In this instance the shank 15a has a length corresponding to the thickness of layer 19 and the thickness of the printed lead 23.

As again best seen in FIG. 1, layers 19 and 21 of board 11 have aligned apertures 45 and 46 that provide a socket forming hole in the assembled board structure 11. These apertures 45 and 46 are aligned with the contact surface area 47 of lead 31. Lead 25 in the illustrated embodiment has an annular contact surface area 48 which surrounds the external opening at the mounting side of board 11 while lead 29 has a lead area that surrounds the aperture 46. In making the electrical connection between leads 31 and 25 in this instance, the shoulder 16b of pin 16 bears against and hence is in physical contact with the contact surface area 48 while the end extremity 49 of shank 16a bears against and is in physical contact with contact surface area 47. In this instance, the metal shank 16a of connector 16 is equipped with a cylindrical sleeve 50 that is made of suitable electrically nonconductive material. Sleeve 50 is located between the shoulder and end extremity of pin 16 and serves to electrically isolate the shank from the lead element 29.

Again as best seen in FIG. 1, layers 19 and 21 of board 11 are provided with aligned apertures 52 and 53 that provide a socket forming hole in the assembled circuit board that is aligned with a contact surface area 54 of lead 30. Lead 24 has an annular contact area 55 that surrounds the external opening of the hole provided by apertures 52 and 53, and in the assembled apparatus 10, the shoulder 17*b* of connector 17 bears against and is in physical contact with the contact surface area 55 while the end extremity 56 of shank 17*a* bears against and is in physical contact with the contact surface area 54 of printed lead element 30.

FIG. 1 also shows that layers 19 and 20 are provided with aligned apertures 58 and 59 which again provide a socket forming hole in the assembled circuit board that is aligned with a contact surface area 60 of lead 31. In this instance connector pin 16 only serves to connect lead 31 with resistors 13 and hence the shoulder 18b bears against the exterior surface 22 at the mounting side 39 of board 11 while the end extremity 61 of the shank bears against the contact surface area 60.

Layer 19 has yet another hole 63 which in the assembled circuit board 11 is aligned with the contact surface area 64 of lead 29. Printed lead 26, as also shown in this figure, has an annular contact surface area 65 and in the assembled apparatus, the flange or shoulder 32*b* of connector 32 bears against and is in physical contact with the contact surface area 65 while the end extremity 66 of the shank 32*a* bears against and is in physical contact with contact surface area 64 in making the electrical connection.

The connector pins may be made of copper, brass, aluminum or other suitable electrically conductive metal and the shoulders are formed integral with the shanks in the manufacture of the pins. In the preferred practice of the invention, the socket forming holes in the boards for the pin shanks have the same or a slightly smaller cross sectional dimension as the shanks that are to be received in the holes so that the pins in practice are press fit in the holes during the assembly operation and are retained in place by frictional contact with the layer surfaces that define the periphery of the socket area. It is within the advent of the invention however to coat the sides of the shanks with a suitable adhesive material which will serve to retain the pins in place, but such a practice is less desirable since careless use of coating materials by people involved in assemblying the apparatus frequently results in inadvertent coating of the end extremity or shoulder of the pin and which of course interferes with the obtainment of the electrical connection.

Figure 6:
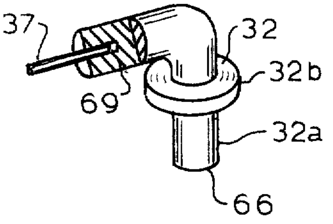
FIG. 6 is an isometric view of one pin-type connector seen in FIGS. 3 and 4.
Figure 7:
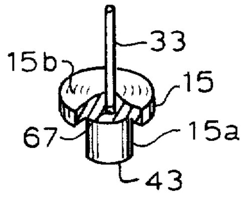
FIG. 7 is an isometric view of yet another pin-type connector seen in FIGS. 3 and 4.

The means by which the lead wires of the circuit component are connected to the connector pins is best illustrated in FIGS. 6 through 8 inclusive. As seen in FIG. 6, pin 32 is equipped with an elbow shaped head that is provided with a hole 69 in which the grounded lead wire 37 is received. In FIG. 7 it will be seen that pin 15 has an axially extending hole 67 in which lead wire 33 of the capacitor is received. Similarly in FIG. 8 it will be seen that connector 16 has an axially extending hole 68 in which lead wire 34 is received. These holes are of a size sufficient to accommodate the wire that is to be connected to the pin and are of a size that permits the wire to be press fit into the hole and retained therein by friction and without the need for a soldered connection.

From the illustration it will be evident that pins of various different lengths will normally be used in mounting the circuit components on the laminated board structures and in practice it is preferable that the socket and shank diameters for the pins requiring the least penetration into the board structure have the largest diameters and that the diameters progressively increase with each deeper penetration required in the circuit board structure so as to aid the assembly operator in the proper selection of pins and simultaneously avoid possible damage to the internally located printed leads through the use of a pin longer than that accommodatable in the socket area.

While only certain preferred embodiments of this invention have been shown and described by way of illustration, many modifications will occur to those skilled in the art and it is, therefore, desired that it be understood that it is intended herein to cover all such modifications as fall within the true spirit and scope of this invention.

What is claimed as new and what it is desired to secure by Letters patent of the United States is:

1. An electrical apparatus comprising a rigid laminated circuit board having opposite sides, a first electrically nonconductive layer having an internal surface located between said sides and imprinted with a flat electrically conductive lead element, and a second electrically nonconductive layer having an internal surface which facially confronts the imprinted internal surface of the first layer, said board having a hole extending through said second layer and communicating with the exterior of the board at one of said sides, and said hole having an internal extremity defined by a contact surface area of said flat lead element; said apparatus further comprising a circuit component mounted on said board at said one of said sides and having a lead wire electrically connected to said flat lead element by an electrically conductive metal connector which electrically interconnects said lead wire and said flat lead element and having a shank press fitted in said hole and in frictional engagement with said second layer, said shank having an end extremity in physical contact with said contact surface area, and said lead wire being in physical contact with said connector at said one of said sides.

2. An electrical apparatus in accord with claim 1 wherein the first and second layers are of uniform thickness, and wherein said connector has a shoulder integral with said shank and with said shoulder being in engagement with said board at said one of said sides.

3. An electrical apparatus in accord with claim 1 wherein said connector has an aperture at said one side and wherein said lead wire has an end portion press fitted in said aperture.

4. An electrical apparatus comprising a rigid laminated circuit board having opposite sides, a first electrically nonconductive layer having an internal surface located between said sides and imprinted with a flat electrically conductive lead element, and a second electrically nonconductive layer having an internal surface which facially confronts the imprinted internal surface of the first layer, said board having a hole extending through said second layer and communicating with the exterior of the board at one of said sides, and said hole having an internal extremity defined by a contact surface area of said flat lead element; said apparatus further comprising a circuit component mounted on said board at said one of said sides and having a lead wire electrically connected to said flat lead element by an electrically conductive metal connector which electrically interconnects said lead wire and said flat lead element and having a shank located in said hole and a shoulder integral with said shank and in engagement with said board at said one of said sides, said shank having an end extremity in physical contact with said contact surface area, said lead wire being in physical contact with said connector at said one of said sides, said first and second layers being of uniform thickness, and said apparatus further comprising a sleeve of electrically nonconductive material surrounding said shank between its end extremity and said shoulder and which is press fitted in said hole and in frictional engagement with said second layer.

* * * * *